United States Patent
Tien et al.

(10) Patent No.: US 11,446,712 B2
(45) Date of Patent: *Sep. 20, 2022

(54) SYSTEM FOR CLEANING WAFER IN CMP PROCESS OF SEMICONDUCTOR MANUFACTURING FABRICATION

(71) Applicant: Taiwan Semiconductor Manufacturing Company, Ltd., Hsinchu (TW)

(72) Inventors: Chia-Ying Tien, Taipei (TW); Chia-Lin Hsueh, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/095,938

(22) Filed: Nov. 12, 2020

(65) Prior Publication Data

US 2021/0060624 A1    Mar. 4, 2021

Related U.S. Application Data

(60) Continuation of application No. 15/464,525, filed on Mar. 21, 2017, now Pat. No. 10,864,557, which is a
(Continued)

(51) Int. Cl.
*B08B 3/12* (2006.01)
*H01L 21/02* (2006.01)
(Continued)

(52) U.S. Cl.
CPC .................. *B08B 3/12* (2013.01); *B08B 1/00* (2013.01); *B08B 1/007* (2013.01); *B08B 1/04* (2013.01);
(Continued)

(58) Field of Classification Search
None
See application file for complete search history.

(56) References Cited

U.S. PATENT DOCUMENTS 5,806,126 A    9/1998    de Larios
7,040,332 B2 *    5/2006    Boyd .................. B08B 3/12
                                                    134/1
(Continued)

FOREIGN PATENT DOCUMENTS

CN    202398590 U    8/2012
TW    476099    2/2002
(Continued)

OTHER PUBLICATIONS

Chinese language office action dated Sep. 23, 2016, issued in application No. TW 104136619.
(Continued)

*Primary Examiner* — Sylvia MacArthur
(74) *Attorney, Agent, or Firm* — McClure, Qualey & Rodack, LLP (57) ABSTRACT

A system for performing a Chemical Mechanical Polishing (CMP) process is provided. The system includes a CMP module configured to polish a semiconductor wafer. The system further includes a cleaning brush assembly configured to clean the semiconductor wafer. The cleaning brush includes a rotation shaft and a brush member surrounding a segment of the rotation shaft. The system also includes an
(Continued)

agitation transducer arranged to be distant from the brush member and configured to produce an agitated cleaning liquid to clean the cleaning brush assembly.

20 Claims, 9 Drawing Sheets

Related U.S. Application Data division of application No. 14/674,138, filed on Mar. 31, 2015, now Pat. No. 9,610,615.

(51) Int. Cl.
| | | |
|---|---|---|
| *H01L 21/67* | (2006.01) | |
| *B08B 1/00* | (2006.01) | |
| *B08B 1/04* | (2006.01) | |
| *B24B 37/20* | (2012.01) | |
| *B24B 37/34* | (2012.01) | |

(52) U.S. Cl.
CPC .............. *B24B 37/20* (2013.01); *B24B 37/34* (2013.01); *H01L 21/02065* (2013.01); *H01L 21/02074* (2013.01); *H01L 21/67028* (2013.01); *H01L 21/67046* (2013.01)

(56) References Cited

U.S. PATENT DOCUMENTS

| | | | |
|---|---|---|---|
| 8,327,861 B2* | 12/2012 | Yin | ............................ B08B 3/12 134/95.1 |
| 10,864,557 B2* | 12/2020 | Tien | ............................ B08B 3/12 |
| 2006/0016029 A1 | 1/2006 | Mikhaylichenko | |
| 2014/0196744 A1 | 7/2014 | Wu et al. | |
| 2014/0310895 A1 | 10/2014 | Chen | |
| 2015/0096591 A1* | 4/2015 | Zhang | ............... H01L 21/67046 134/6 |
| 2021/0060624 A1* | 3/2021 | Tien | .................. H01L 21/02065 |

FOREIGN PATENT DOCUMENTS

| | | |
|---|---|---|
| TW | 201428832 A | 7/2014 |
| TW | 201501820 A | 1/2015 |

OTHER PUBLICATIONS

Tsujumura, M.; "In Applications of Chemical Mechanical Planarization;" Edited by Y. Li; published by John Wiley & Sons; 2009; Chapter 3.

* cited by examiner

SYSTEM FOR CLEANING WAFER IN CMP PROCESS OF SEMICONDUCTOR MANUFACTURING FABRICATION

CROSS REFERENCE

This Application is a Continuation of U.S. application Ser. No. 15/464,525, filed on Mar. 21, 2017, now U.S. Pat. No. 10,864,557, which is a Divisional of U.S. application Ser. No. 14/674,138, filed on Mar. 31, 2015, now U.S. Pat. No. 9,610,615, the entirety of which is incorporated by reference herein.

BACKGROUND

Semiconductor devices are used in a variety of electronic applications, such as personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of the semiconductor devices, various processing steps are used to fabricate integrated circuits on a semiconductor wafer. Generally, the processes include a chemical mechanical polishing (CMP) process for planarization of semiconductor wafers. A challenge of the CMP process is to produce a clean substrate surface following the polishing. Therefore, a concern with the use of a CMP process is the efficient and complete removal of the polishing slurry and other polishing residues and particulates following polishing in order to prevent introduction of defects into the polished product. Ideally, post-CMP cleaning should remove all polishing slurry, polishing residues and particulates in a quick and repeatable fashion without introducing additional defects or damage to the substrate surface.

Although existing methods and devices for cleaning the semiconductor wafer after the CMP process have been generally adequate for their intended purposes, they have not been entirely satisfactory in all respects. Consequently, it would be desirable to provide a solution for the process control for semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

Figure 1:
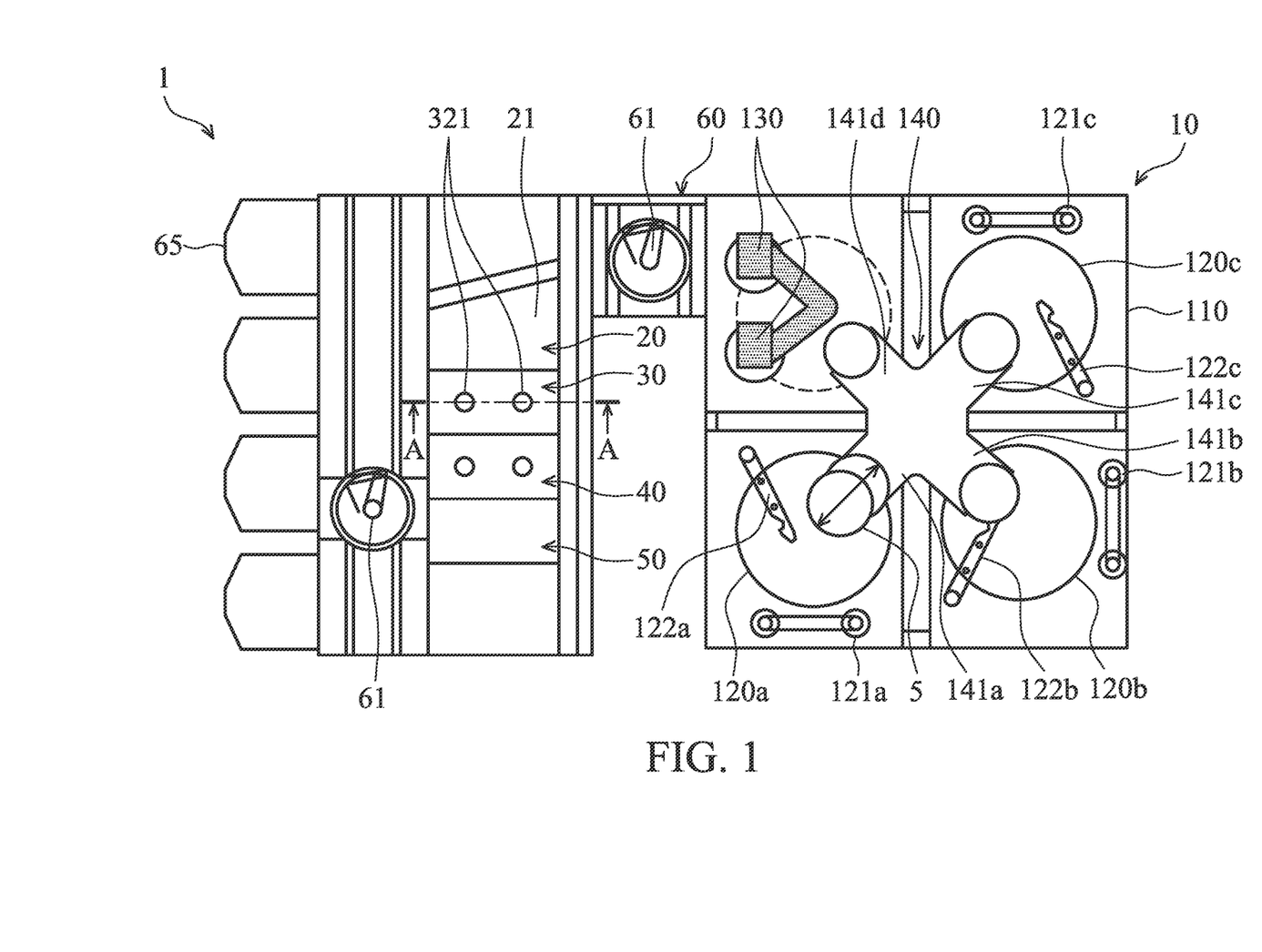
FIG. 1 is a schematic view of a Chemical Mechanical Polishing (CMP) system for processing a semiconductor wafer, in accordance with some embodiments.

FIG. 1 is a schematic view of a Chemical Mechanical Polishing (CMP) system 1 for processing a semiconductor wafer 5, in accordance with some embodiments. The CMP system 1 includes a CMP module 10, a rinse station module 20, a number of cleaning modules, such as the cleaning modules 30 and 40, a spin-rinse-dry (SRD) module 50, and a number of transferring modules 60. The elements of the CMP system 1 can be added to or omitted, and the disclosure should not be limited by the embodiments.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, a shallow trench isolation (STI) layer, an inter-layer dielectric (ILD), or an inter-metal dielectric layer covers the device elements formed on the semiconductor wafer 5.

The CMP module 10 is configured for performing a planarization process on a semiconductor wafer 5 in a semiconductor manufacturing process. In some embodiments, the CMP module 10 includes a base 110, a number of polishing pads 120a, 120b, and 120c, a number of load cups 130, and a head rotation unit 140. The elements of the CMP module 10 can be added to or omitted, and the disclosure should not be limited by the embodiments.

In some embodiments, the polishing pads 120a, 120b, and 120c are provided on the base 110. The three polishing pads 120a, 120b and 120c facilitate simultaneous processing of multiple wafers in a short time. Each of the polishing pads is mounted on a rotatable carousel (not shown in the figures). Pad conditioners 121a, 121b and 121c are provided on the base 100 and can be swept over the respective polishing pads 120a, 120b and 120c for conditioning of the polishing pads 120a, 120b and 120c. Slurry supply arms 122a, 122b and 122c are further provided on the base 110 for supplying slurry to the surfaces of the respective polishing pads 120a, 120b and 120c.

The load cups 130 are configured for the loading and unloading of semiconductor wafers 5. In some embodiments, each the load cup 130 includes a circular pedestal on which the semiconductor wafer 5 is placed for loading the semiconductor wafer 5 onto the polishing pads 120a, 120b and 120c, and for unloading the semiconductor wafer 5 from the polishing pad 120a, 120b and 120c.

The head rotation unit 140 has a number of polishing heads 141a, 141b, 141c, and 141d for holding and fixedly rotating the semiconductor wafers 5 on the polishing pads 120a, 120b and 120c. The polishing heads 141a, 141b, 141c, and 141d of the head rotation unit 140 are mounted on respective rotation shafts (not shown in the figures) which are rotated by a driving mechanism inside the head rotation unit 140. The polishing heads 141a, 141b, 141c, and 141d hold respective semiconductor wafers 5 and press the semiconductor wafers 5 against the top surfaces of the respective polishing pads 120a, 120b and 120c. In this manner, material layers are removed from the respective semiconductor wafers 5.

The rinse station module 20 includes a container 21 in accordance with some embodiments. The container 21 is configured for submerging a semiconductor wafer 5 within a cleaning fluid contained therein. In some embodiments, the rinse station module 20 may include a transducer (not shown in the figures) mounted to the bottom of the container 21. The transducer is used to direct sonic energy upward to the semiconductor wafer 5. Thus, sonic energy from the transducer is directed vertically toward to the semiconductor wafer 5. As a result, the semiconductor wafer 5 is impacted by equal amounts of sonic energy during each full revolution of the semiconductor wafers 5.

Figure 2:
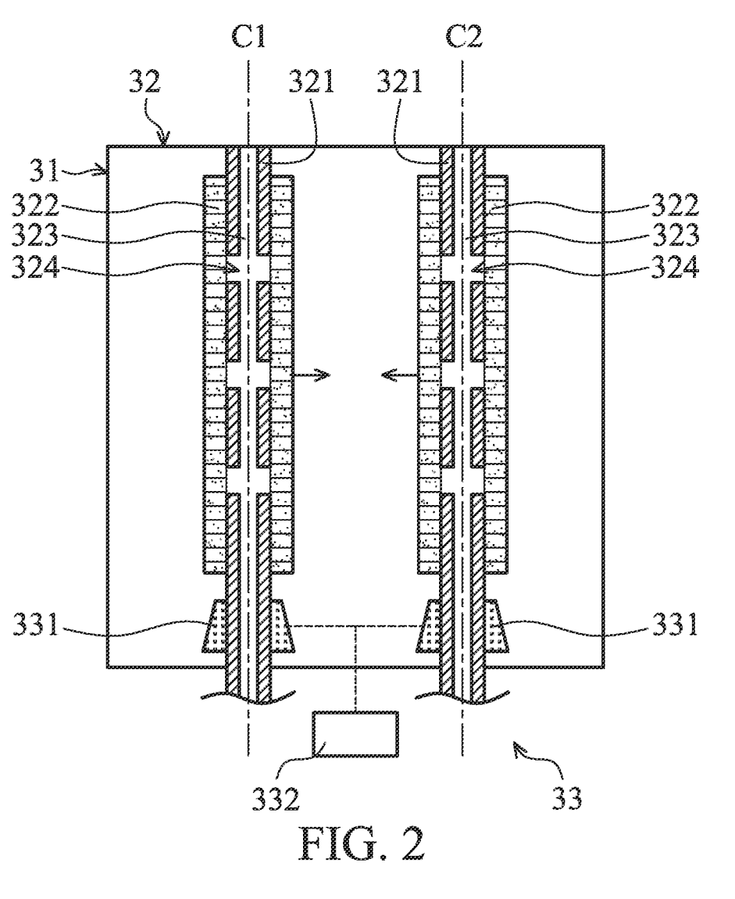
FIG. 2 is a cross-sectional view taken along line A-A of FIG. 1.

The first cleaning module 30 is arranged adjacent to the rinse station module 20 and is configured to receive the semiconductor wafer 5 which has been cleaned by the rinse station module 20. In some embodiments, as shown in FIG. 2, the first cleaning module 30 includes a cleaning tank 31, a cleaning brush assembly 32, and a liquid agitation assembly 33.

In some embodiments, the cleaning brush assembly 32 includes two rotation shafts 321 and two brush members 322. One of the rotation shafts 321 extends along a rotation axis C1 and is rotatable about the corresponding rotation axis C1. The other rotation shaft 321 extends along a rotation axis C2 and is rotatable about the corresponding rotation axis C2. In some embodiments, the rotation axes C1 and C2 are parallel to a vertical direction. A main fluid path 323 is formed in each of the rotation shafts 321. In addition, a number of holes 324 are formed on an outer wall of each of the rotation shafts 321 and fluidly connects to the main fluid path 323. In some embodiments, the two rotation shafts 321 are arranged in a movable manner such that the distance between the two rotation shafts 321 is adjustable.

The two brush members 322 respectively connect to the two rotation shafts 321. Each of the two brush members 322, for example, includes a sponge. In some embodiments, each of the brush members 322 circumferentially surrounds the corresponding rotation shafts 321 and covers the holes 324 formed on the outer wall of the rotation shaft 321. As shown in FIG. 1, two ends of each of the rotation shafts 321 are not covered by the brush members 322. The rotation shaft 321 may be held by a cap which is configured to drive the rotation shaft 321 to rotate.

The liquid agitation assembly 33 includes two agitation transducers 331, and a signal generator 332 electrically connected to the agitation transducers 331, in accordance with some embodiments. In some embodiments, the two agitation transducers 331 are respectively connected to the two rotation shafts 321. Each of the two agitation transducers 331 may circumferentially surround a segment of the corresponding rotation shafts 321 which is not covered by the brush member 322. In some embodiments, during operation, an alternating voltage from the signal generator 332 is applied to the agitation transducers 331 resulting in transducer oscillation between compression and expansion thereby coupling megasonic energy to the fluid passing through the rotation shafts 321.

In some embodiments, the first cleaning module 30 further includes two wafer supports (not shown in figures). The two wafer supports are configured to vertically support the semiconductor wafer 5. The two supports are rotatable, and each preferably comprises a rotatable wheel having a v-shaped groove for supporting the semiconductor wafer 5 with minimal contact. A motor may be coupled to the two supports to drive the two supports to actively rotate. Therefore, the two supports act as a rotating mechanism for causing the semiconductor wafer 5 to rotate. However, it should be appreciated that many variations and modifications can be made to embodiments of the disclosure.

It is appreciated that the configuration of the first cleaning module 30 should not be limited to the embodiments mentioned above, and the liquid agitation assembly 33 can be modified as long as the agitated liquid can be applied on the brush member 322.

Figure 3:
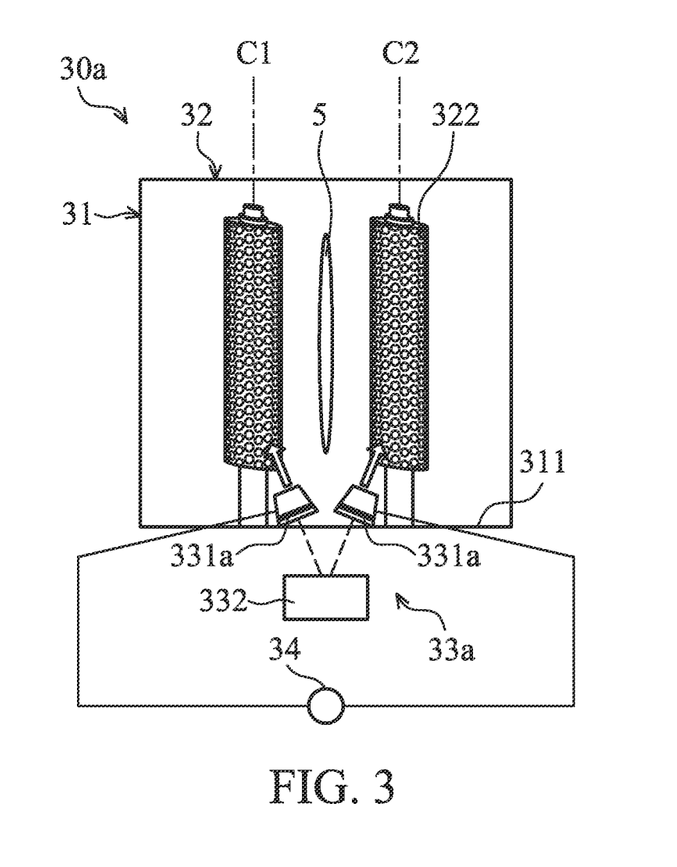
FIG. 3 is a schematic view of a cleaning module, in accordance with some embodiments.

FIG. 3 shows a schematic view of a first cleaning module 30a, in accordance with some embodiments. In some embodiments, differences between the first cleaning module 30a and the first cleaning module 30 shown in FIG. 2 include the two agitation transducers 331a of a liquid agitation assembly 33a being positioned on the side panel 311 of the cleaning tank 31. In some embodiments, a number of side walls define a space for cleaning the semiconductor wafer 5, and the two agitation transducers 331a are positioned on different side walls of the cleaning tank 31.

In some embodiments, the two agitation transducers 331a is fluidly connected to a cleaning liquid source 34 and is configured to agitate a cleaning liquid from the cleaning liquid source 34 to clean the brush member 322. The two agitation transducers 331a may apply the agitated cleaning liquid to the outer surface of the brush member 322 at an angle ranging from about 0 degrees to about 180 degrees relative to the vertical direction parallel to the rotation axis C1 of the cleaning brush assembly 32. With the agitated cleaning liquid supplied by the two agitation transducers 331a, the contaminated particles accumulated in the brush member 322 are removed.

Figure 4:
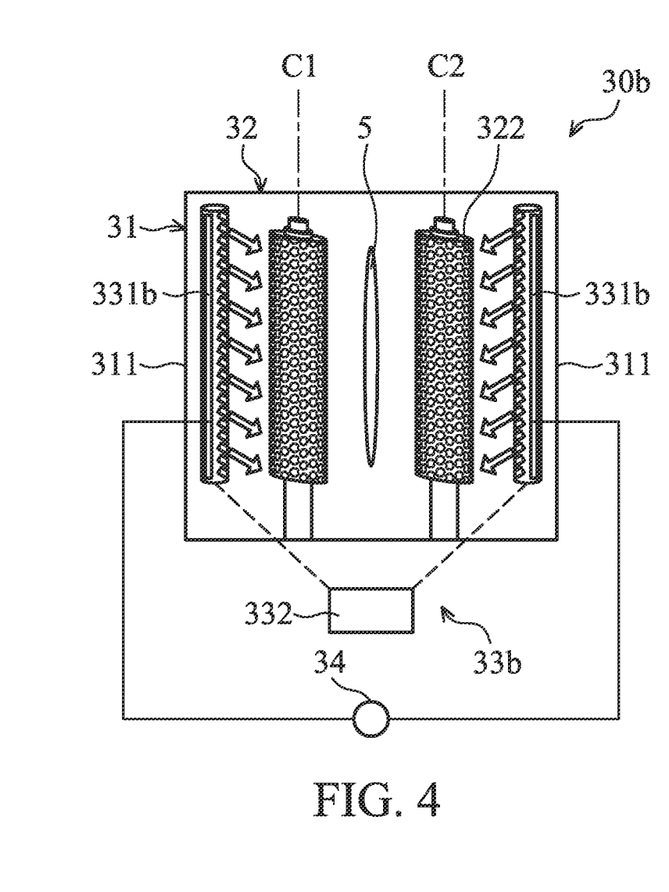
FIG. 4 is a schematic view of a cleaning module, in accordance with some embodiments.

FIG. 4 shows a schematic view of a first cleaning module 30b, in accordance with some embodiments. In some embodiments, differences between the first cleaning module 30b and the first cleaning module 30 shown in FIG. 2 include the two agitation transducers 331b of a liquid agitation assembly 33a being positioned on the side panel 311 of the cleaning tank 31 and extending for a predetermined length that is greater than the diameter of the semiconductor wafer 5.

In some embodiments, the two agitation transducers 331b is fluidly connected to a cleaning liquid source 34 and is configured to agitate a cleaning liquid from the cleaning liquid source 34 to clean the brush member 322. The two agitation transducers 331b may be equal in length to the brush member 322 in a vertical direction parallel to the rotation axis C1. Alternatively, each of the two agitation transducers 331b has a length that is greater than that of the brush member 322 in the vertical direction. With the agitated cleaning liquid supplied by the two agitation transducers 331b, the entire outer surface of each of the brush members 322 is sufficiently cleaned during the rotation of the brush members 322.

In some embodiments, the two agitation transducers 331b and the two rotation shafts are arranged along a straight line. In some embodiments, the two agitation transducers 331b and the two rotation shafts are not arranged along a straight line. The two agitation transducers 331b may offset with an imaginary line connecting between the two rotation shafts 321.

Referring to FIG. 1, the second cleaning module 40 is arranged adjacent to the first cleaning module 30 and is configured to receive the semiconductor wafer 5 which has been cleaned by the first cleaning module 30. The second cleaning module 40 may be the same or different from the first cleaning module 30. For example, the first cleaning module 30 has a configuration as shown in FIG. 2, and the second cleaning module 40 has a configuration as shown in FIG. 3. In addition, the cleaning liquid supplied to the first cleaning module 30 may be the same or different from that supplied to the second cleaning module 40. Moreover, the agitated cleaning liquid in different cleaning modules may be agitated at the same or different frequency, so as to enhance cleaning efficiency.

The SRD module 50 is arranged adjacent to the second cleaning module 40 and is configured to receive the semiconductor wafer 5 which has been cleaned by the second cleaning module 40. When the semiconductor wafer 5 is transferred to the SRD module 50, the semiconductor wafer 5 is rinsed with deionized water and then dried.

The transferring module 60 includes one or more driving elements (not shown in figures) and a number of robot arms 61, in accordance with some embodiments. The driving element, such as a motor, is controlled by a control module and is coupled to the robot arms 61. The robot arms 61 are driven by the driving element to provide both radial and rotational movement in a fixed plane to pick up, transfer, and deliver the semiconductor wafer 5 from one location within the CMP system 1 to another. For example, with the transferring module 60, the semiconductor wafer 5 is transferred between a carrier 65, such as a FOUP, and the CMP module 10. Alternatively, the semiconductor wafer 5 is transferred between the CMP module 10 and the rinse station module 20 by the transferring module 60. Alternatively, the semiconductor wafer 5 is transferred between the SRD module 50 and the carrier 65.

Figure 5:
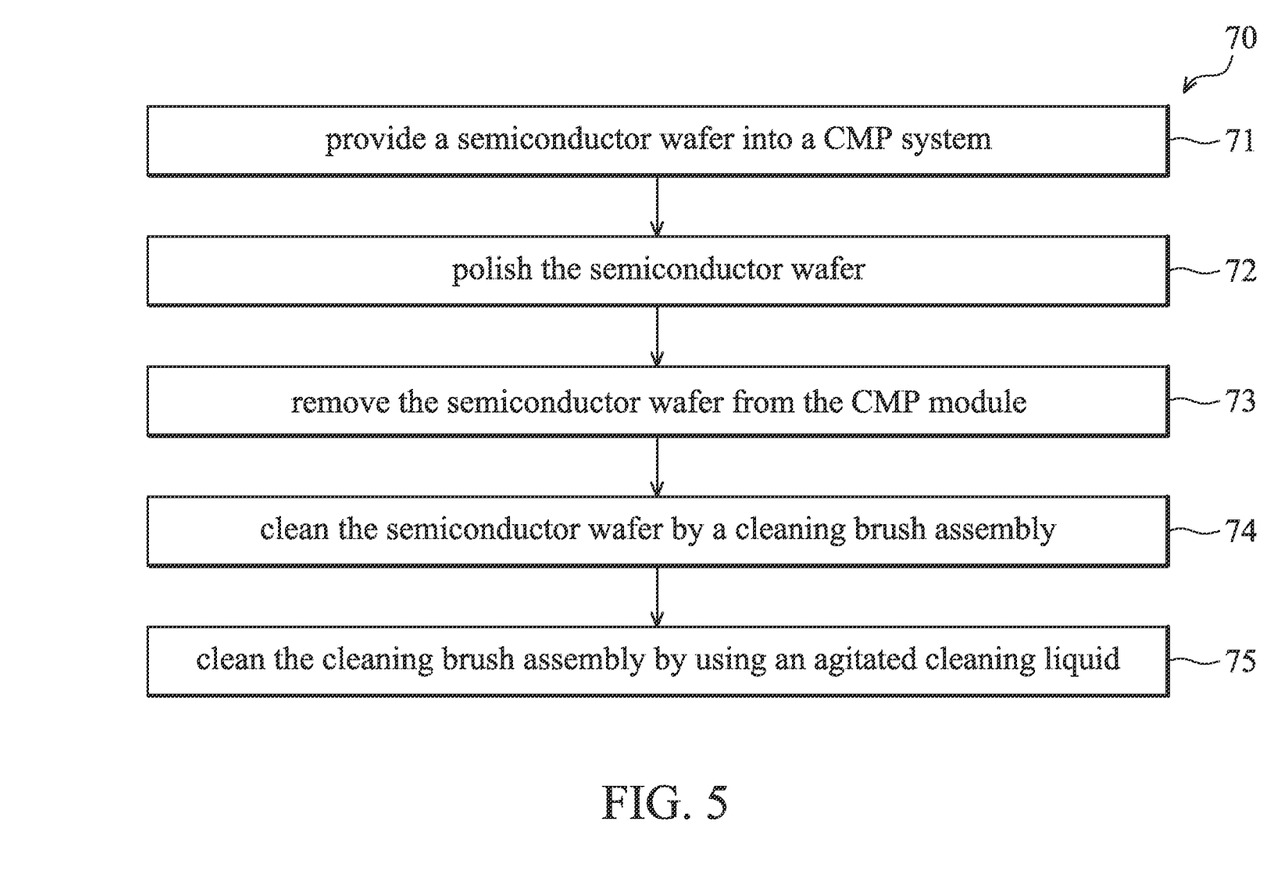
FIG. 5 is a flow chart of methods for processing a semiconductor wafer, in accordance with some embodiments.

FIG. 5 is a flow chart illustrating a method 70 for cleaning a wafer, in accordance with some embodiments. For illustration, the flow chart will be described with the schematic views shown in FIGS. 1 and 2. Some of the stages described can be replaced or eliminated for different embodiments. Additional features can be added in the semiconductor device structure. Some of the features described below can be replaced or eliminated for different embodiments.

The method 70 begins with an operation 71 in which one or more semiconductor wafer (such as semiconductor wafer 5) is provided into a CMP module (such as CMP module 10). In some embodiments, the semiconductor wafer 5 is transferred into the CMP module 10 by the transferring module 60 from a carrier 65.

The method 70 continues with operation 72, in which the semiconductor wafer 5 is polished by at least one polishing pad (such as polishing pads 120a, 120b, 120c) of the CMP module 10. Each polishing pad represents a separate polishing step in which a different material on the wafer may be polished. For example, the first polishing step on the first polishing pad 120a may be a copper polishing step; the second polishing step on the second polishing pad 120b may be a tantalum nitride (TaN) polishing step; and the third polishing step on the third polishing pad 120c may be an oxide polishing step. However, it should be appreciated that many variations and modifications can be made to embodiments of the disclosure.

The method 70 continues with operation 73, in which the semiconductor wafer 5 is removed from the CMP module 10. In some embodiments, the semiconductor wafer 5 is removed from the CMP module 10 by the transferring module 60 and transferred to the rinse station module 20 or the first cleaning modules 30 to clean or remove polishing residue after chemical mechanical polishing.

The method 70 continues with operation 74, in which the semiconductor wafer 5 is cleaned by a cleaning brush assembly (such as cleaning brush assembly 32). In some embodiments, the semiconductor wafer 5 processed by the CMP module 10 is transferred to the first cleaning module 30. In the first cleaning module 30, the semiconductor wafer 5 is arranged vertically and positioned between the two rotation shafts 321. The distance between the two rotation shafts 321 may be adjusted after the semiconductor wafer 5 is positioned therebetween such that contact between the two brush members 322 and the semiconductor wafer 5 is created.

Figure 6A:
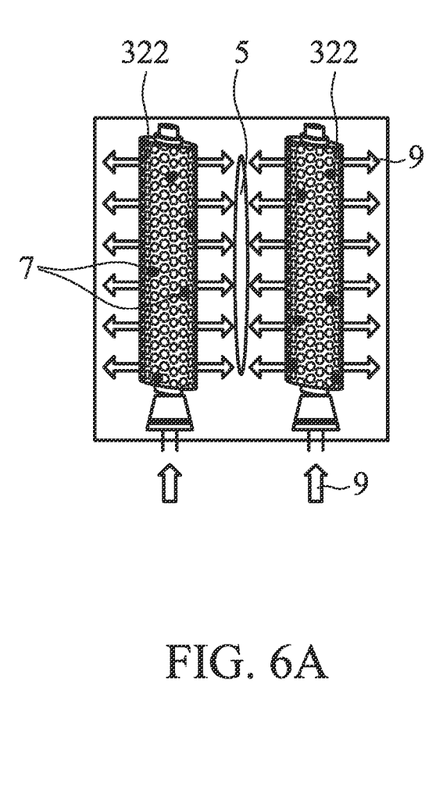
FIGS. 6A-6C are cross-sectional views of a scrubber after being used to clean different wafers, in accordance with some embodiments.

As shown in FIG. 6A, in some embodiments, the two rotation shafts 321 are driven to rotate to clean the front and back surfaces of the semiconductor wafer 5. In addition, the semiconductor wafer 5 is also rotated while being cleaned in the first cleaning modules 30. In some embodiments, a cleaning liquid 9, such as deionized water (DIW) or citric acid, is provided to each brush member 322 via the main flow path 323 and the holes 324 of the corresponding rotation shaft 321 during the wafer cleaning operation. When the cleaned brush member 322 touches the semiconductor wafer 5, which is rotating, particles and/or contaminants on the semiconductor wafer 5 are removed by the brush member 322 and the cleaning fluid.

Figure 6B:
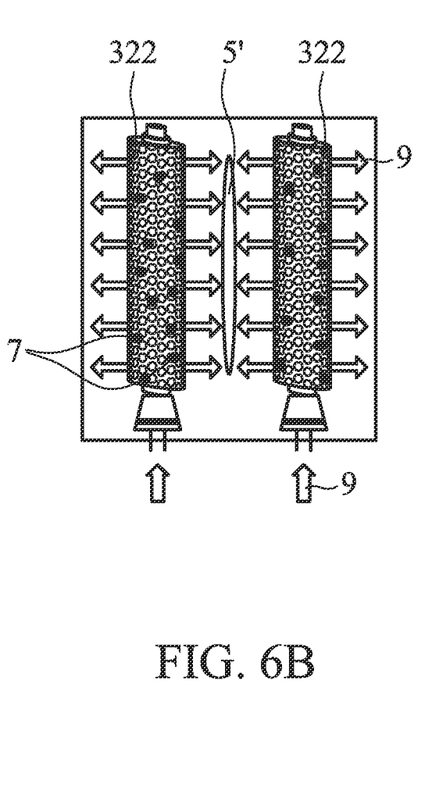
Figure 6C:
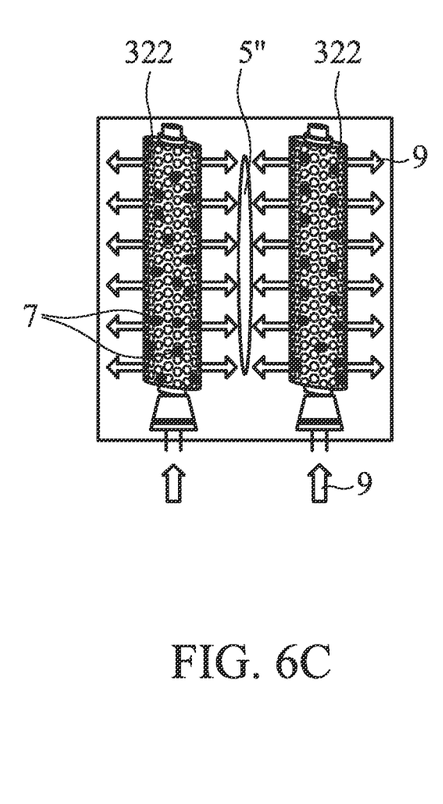

However, when the brush member 322 is used to clean the semiconductor wafer(s) for a while, the cleaning efficiency would be reduced due to particles (or contaminants) accumulating on the brush member 322. FIGS. 6A-6C are schematic views of the brush member 322 after being used to clean different wafers, in accordance with some embodiments.

As shown in FIG. 6A, after the semiconductor wafer 5 is cleaned using the brush member 322, contaminating particles 7 (or contaminants) accumulate on the brush member 322. As shown in FIG. 6B, after the brush member 322 is further used to clean more wafers including a semiconductor wafer 5', more contaminating particles 7 accumulate on the brush member 322. As the brush member 322 is continually used for cleaning semiconductor wafers, more and more contaminating particles 7 may adhere to the brush member 322 and contaminate the brush member 322. Therefore, when the brush member 322 is used to clean a new wafer, some of the particulate contaminants may fall on the new wafer, degrading the cleaning effect of the brush member 322.

For example, as shown in FIG. 6C, after the brush member 322 continues to be used to clean even more wafers including a semiconductor wafer 5", even more contaminating particles 7 accumulate on the brush member 322. In some embodiments, some of the contaminating particles 7 fall from the brush member 322 and are left on the semiconductor wafer 5". As a result, the semiconductor wafer 5" is not sufficiently cleaned, which will lead to a yield reduction of the semiconductor wafer 5".

Figure 7:
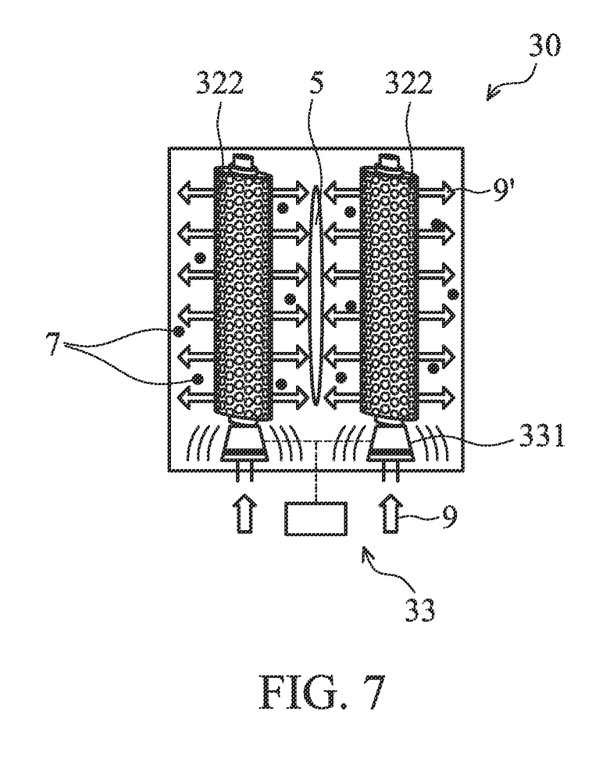
FIG. 7 is a cross-sectional view of stage of a process for cleaning semiconductor wafers in a cleaning module, in accordance with some embodiments.

In order to prevent the problems mentioned above, the method 70 continues to an operation 75, in which the cleaning brush assembly 32 is cleaned by using an agitated cleaning liquid. In some embodiments, as shown in FIG. 7, the cleaning liquid 9 applied into the rotation shafts 321 is agitated by the liquid agitation assembly 33 and transformed to an agitated cleaning liquid 9'. Afterwards, the agitated cleaning liquid 9' is delivered to the brush member 322 via the main flow path 323 and the holes 324 (FIG. 2). Due to the agitated cleaning liquid 9', contaminating particles 7 adhering to the cleaning brush assembly 32 are shaken away from the cleaning brush assembly 32. As a result, the cleaning brush assembly 32 is ready for being used for cleaning another semiconductor wafer 5 which has been polished.

In some embodiments, the brush member 322 is washed by the agitated cleaning liquid 9' applied from the agitation transducers 331c or 331b as shown in FIGS. 3 and 4. In addition, a clean liquid is simultaneously supplied into the rotation shaft of the cleaning brush assembly 32 to rinse the brush member 322. Alternatively, there is no clean liquid being supplied into the rotation shaft of the cleaning brush assembly 32 during the supply of the agitated cleaning liquid 9' from the agitation transducers 331c or 331b.

In some embodiments, since the semiconductor wafer 5 is washed by the brush member 322 which is cleaned by the agitated cleaning liquid 9' while the wafer cleaning process, cleaning process of the embodiments takes less time than the conventional cleaning process. As a result, and an overall throughput of the CMP system 1 is increased. In some embodiments, the time period for performing the operation of cleaning the semiconductor wafer 5 by rotating a cleaning brush assembly 32 ranges from about 20 seconds to about 80 seconds.

In some embodiments, the liquid agitation assembly 33 is operated while the semiconductor wafer 5 is cleaned by the brush member 322. Slurry or residue on the semiconductor wafer 5 is also cleaned by the agitated cleaning liquid 9'. Alternatively or additionally, the liquid agitation assembly 33 is operated after the removal of the semiconductor wafer 5 from the brush member 322. Alternatively or additionally, the liquid agitation assembly 33 is kept in operation regardless of the existence or absence of the semiconductor wafer 5 in the first cleaning module 30. In some embodiments, the agitated cleaning liquid 9' with the contaminating particles 7 is drained away through a liquid outlet unit (not shown in figures) connected to the cleaning tank 31. The contaminated cleaning liquid is not kept in the cleaning tank 31.

In some embodiments, the liquid agitation assembly 33 is capable of agitating the cleaning fluid at a frequency in a range from about 500 KHz to about 2.5 MHz. The frequency of oscillation may be varied according to the particle size accumulated in the cleaning brush assembly 32. For example, if the particles accumulated in the cleaning brush assembly 32 have a relatively large size, the cleaning liquid is oscillated at a low frequency, so that the cleaning efficiency is enhanced. However, it should be appreciated that many variations and modifications can be made to embodiments of the disclosure.

In some embodiments, after the semiconductor wafer 5 is cleaned by the first cleaning module 30, the semiconductor wafer 5 is transferred to the second cleaning module 40 to be cleaned again. Similar to the cleaning process performed in the first cleaning module 30, the brush member 322 in the second cleaning module 40 is also cleaned by using an agitated cleaning liquid.

In some embodiments, after the semiconductor wafer 5 is cleaned by the first cleaning module 30 or the second cleaning module 40, the semiconductor wafer 5 is transferred to the SRD module 50. When the semiconductor wafer 5 is transferred to the SRD module 50, the semiconductor wafer 5 is rinsed with deionized water and then dried before being transferred to the carrier 65.

Figure 8:
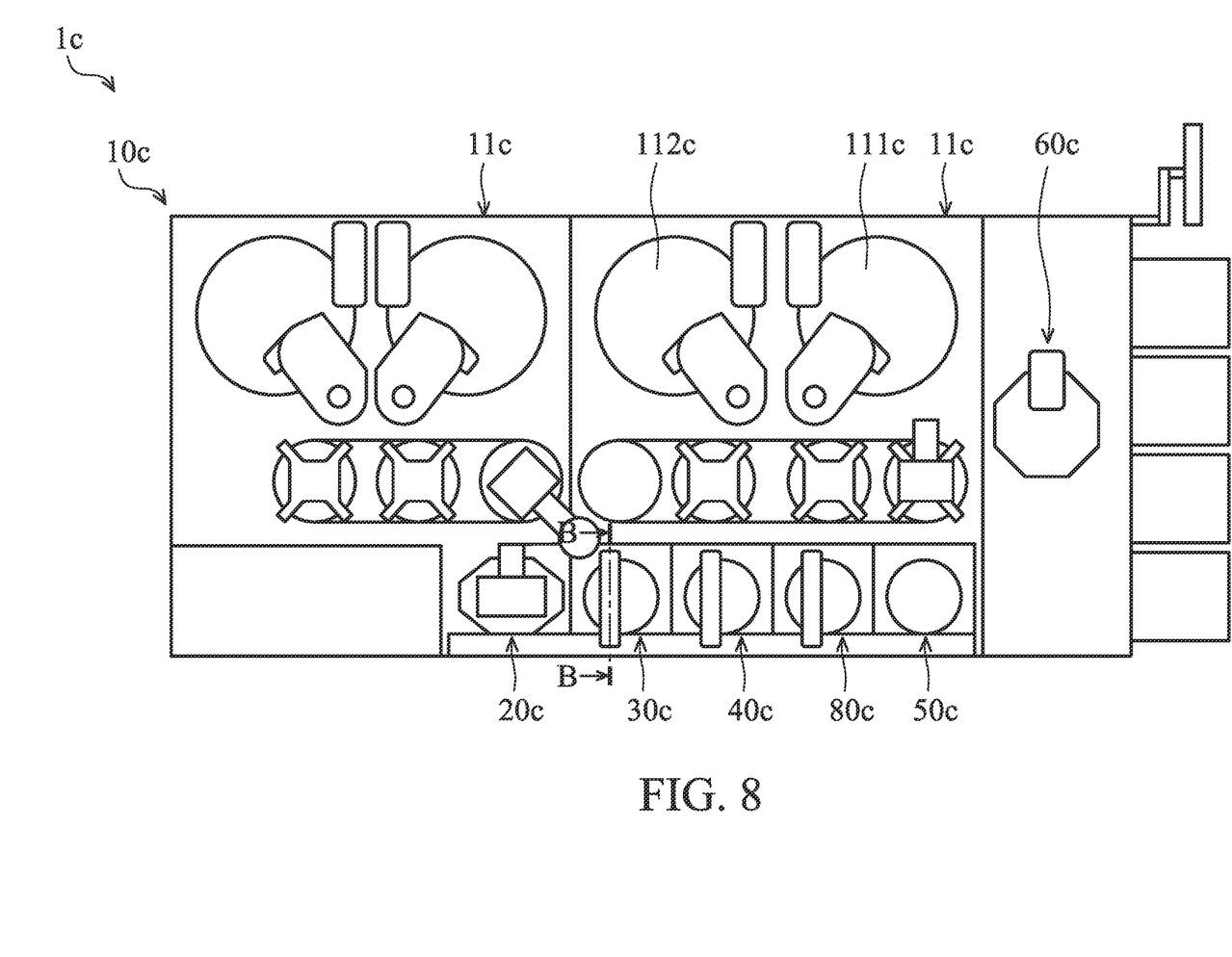
FIG. 8 is a schematic view of a Chemical Mechanical Polishing (CMP) system for processing a semiconductor wafer, in accordance with some embodiments.

FIG. 8 illustrates a Chemical Mechanical Polishing (CMP) system 1c for processing a semiconductor wafer 5, in accordance with some embodiments. The CMP system 1c includes a CMP module 10c, a rinse station module 20c, a number of cleaning modules, such as the cleaning modules 30c, 40c, and 80c, a spin-rinse-dry (SRD) module 50c, and a number of transferring modules 60c. The elements of the CMP system 1c can be added to or omitted, and the disclosure should not be limited by the embodiments.

The CMP module 10c is configured for performing a planarization process of a semiconductor wafer 5 in semiconductor manufacturing process. In some embodiments, the CMP module 10c includes a number of polishing stations 11c. Each polishing station 11c includes a first polishing apparatus 111c and second polishing apparatus 112c. Any number of polishing stations 11c is possible. Each polishing station 11c is configured to provide a first polishing operation and a second polishing operation to a number of semiconductor wafers 5.

In some embodiments, the first polishing operation and the second polishing operation differ by type and chemistry of a polishing slurry used, and process recipe such as spin rate, force applied to the semiconductor wafers 5, and duration of the polish. In some embodiments, the first polishing operation may be a rough polish and the second polishing operation may be a fine polish. In some embodiments, the first polishing operation may be configured to remove dielectric material from the semiconductor wafers 5 and the second polishing operation may be configured to remove metal.

The rinse station module 20c is configured for submerging a semiconductor wafer 5 within a cleaning fluid contained therein. The first cleaning module 30c is arranged adjacent to the rinse station module 20c and is configured to receive the semiconductor wafer 5 which has been cleaned by the rinse station module 20c.

Figure 9:
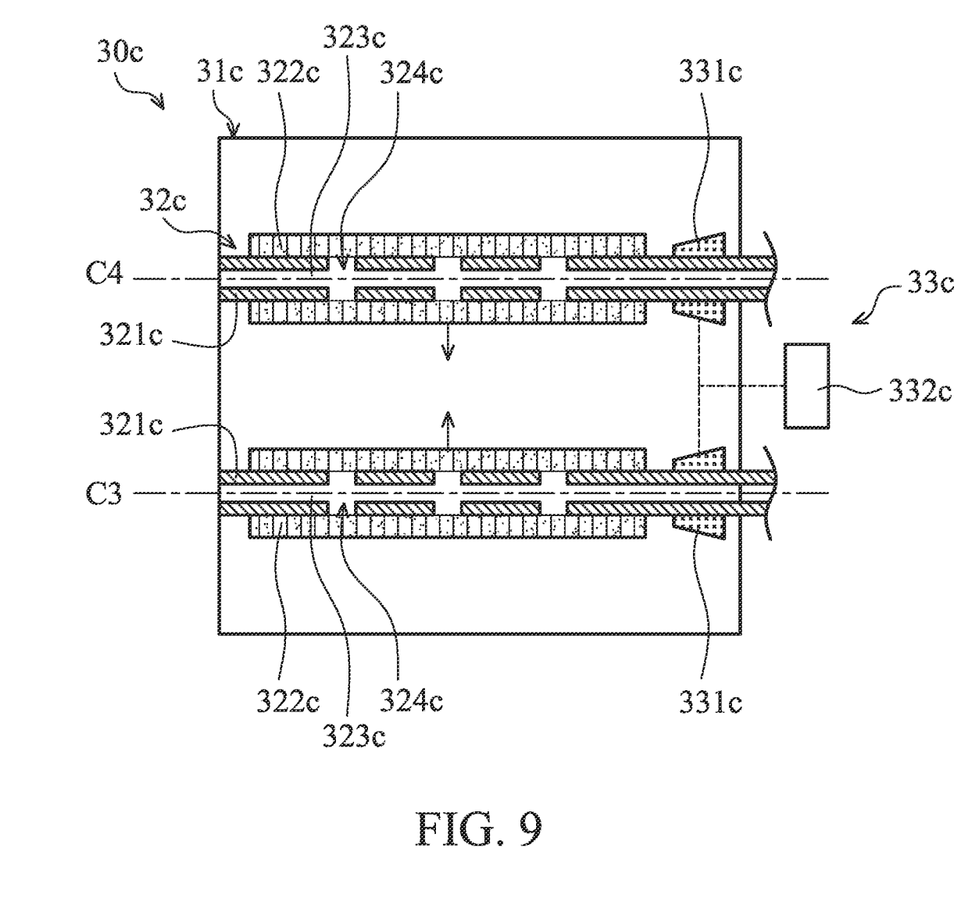
FIG. 9 is a cross-sectional view taken along line B-B of FIG. 8.

As shown in FIG. 9, the first cleaning module 30c includes a cleaning tank 31c, a cleaning brush assembly 32c, and a liquid agitation assembly 33c, in accordance with some embodiments. In some embodiments, the cleaning brush assembly 32c includes two rotation shafts 321c and two brush members 322c. One of the rotation shafts 321c extends along a rotation axis C3 and is rotatable about the corresponding rotation axis C3. The other rotation shaft 321c extends along a rotation axis C4 and is rotatable about the corresponding rotation axis C4. In some embodiments, the rotation axes C3 and C4 are parallel to a horizontal direction. The configurations of the rotation shafts 321c and the brush members 322c may be similar to the rotation shaft 321 and the brush members 322 as shown in FIG. 2, and are not described in detail for brevity. However, it should be appreciated that many variations and modifications can be made to embodiments of the disclosure.

The liquid agitation assembly 33c includes two agitation transducers 331c, and a signal generator 332c electrically connected to the agitation transducers 331c, in accordance with some embodiments. In some embodiments, the two agitation transducers 331c are respectively connected to the two rotation shafts 321c of the cleaning brush assembly 32c. In some embodiments, during operation, an alternating voltage from the signal generator 332c is applied to the agitation transducers 331c resulting in transducer oscillation between compression and expansion thereby coupling megasonic energy to the fluid passing through the rotation shafts 321c.

It is appreciated that the configuration of the first cleaning module 30c should not be limited to the embodiments mentioned above, and the liquid agitation assembly 33c can be modified as long as the agitated liquid can be applied on the brush member 322c.

Figure 10:
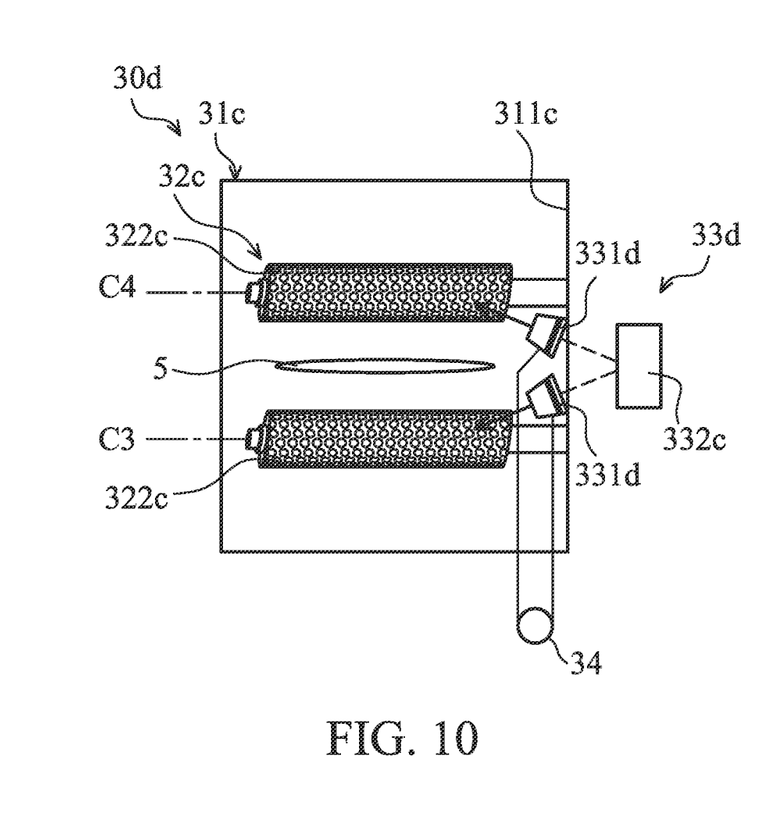
FIG. 10 is a schematic view of a cleaning module, in accordance with some embodiments.

FIG. 10 shows a schematic view of a first cleaning module 30d, in accordance with some embodiments. In some embodiments, differences between the first cleaning module 30d and the first cleaning module 30c shown in FIG. 9 include the two agitation transducers 331d being positioned on the side panel 311c of the cleaning tank 31c.

In some embodiments, the two agitation transducers 331d is fluidly connected to a cleaning liquid source 34 and is configured to agitate a cleaning liquid from the cleaning liquid source 34 to clean the brush member 322c. In some embodiments, the two agitation transducers 331d applies the agitated cleaning liquid toward an outer surface of the brush member 322c by an angle raging from about 0 degree to about 180 degrees relative to a horizontal direction. The horizontal direction is parallel to the rotation axes C3 and C4 of the cleaning brush assembly 32c.

Figure 11:
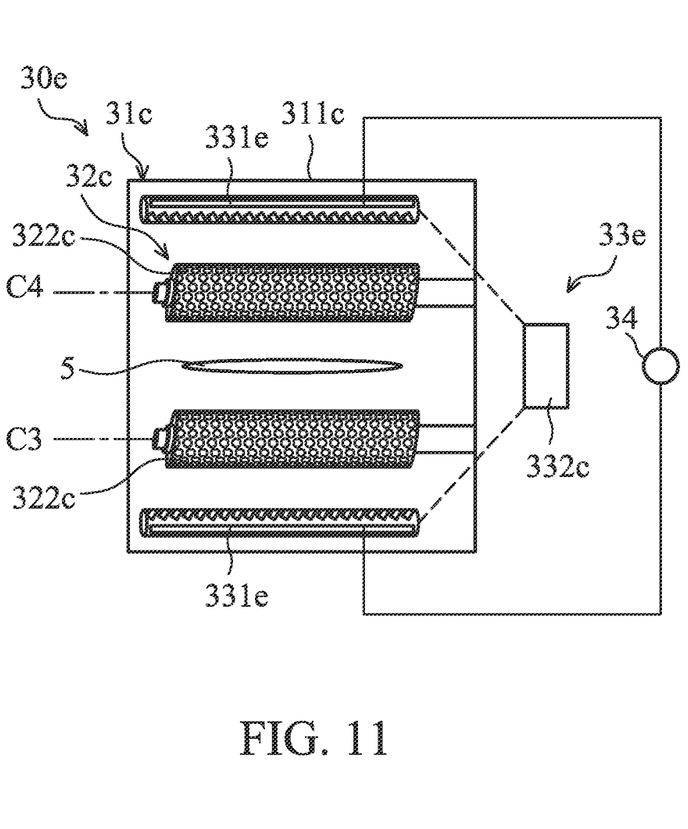
FIG. 11 is a schematic view of a cleaning module, in accordance with some embodiments.

FIG. 11 shows a schematic view of a first cleaning module 30e, in accordance with some embodiments. In some embodiments, differences between the first cleaning module 30e and the first cleaning module 30c shown in FIG. 9 include the two agitation transducers 331e of a liquid agitation assembly 33e being positioned on the side panel 311c of the cleaning tank 31c and extending for a predetermined length larger than the diameter of the semiconductor wafer 5.

In some embodiments, the two agitation transducers 331e is fluidly connected to a cleaning liquid source 34 and is configured to agitate a cleaning liquid from the cleaning liquid source 34 to clean the brush member 322c. The two agitation transducers 331e may be equal in length to the brush member 322c in a horizontal direction parallel to the rotation axes C3 and C4 of the cleaning brush assembly 32c. Alternatively, each of the two agitation transducers 331e has a length larger than that of the brush member 322c in the horizontal direction. With the agitated cleaning liquid supplied by the two agitation transducers 331e, the entire outer surface of each of the brush members 322c is sufficiently cleaned during the rotation of the brush members 322c.

The second cleaning module 40c is arranged adjacent to the first cleaning module 30c and is configured to receive the semiconductor wafer 5 which has been cleaned by the first cleaning module 30c. The third cleaning module 80c is arranged adjacent to the second cleaning module 40c and is configured to receive the semiconductor wafer 5 which has been cleaned by the second cleaning module 40c.

It is appreciated that the second cleaning module 40c and the third cleaning module 80c may have a configuration similar to the various configurations of the first cleaning module 30c, 30d, and 30e disclosed above. In addition, the cleaning liquid supplied to the three cleaning modules may be the same or different. Moreover, the agitated cleaning liquid in the three cleaning modules may be agitated at the same or different frequency, so as to enhance cleaning efficiency.

Embodiments of mechanisms for cleaning a brush member in a post-CMP apparatus described above apply an agitated cleaning liquid to the brush member. Due to the assistance of the agitation energy, the brush member is cleaned efficiently. As a result, a yield reduction of the semiconductor wafer due to contamination is prevented. In addition, since the brush member is reused to clean other wafers, the time period for shutting off the cleaning system for replacing a new brush member can be prolonged, and fabrication cost and time are reduced.

In accordance with some embodiments, a system for performing a Chemical Mechanical Polishing (CMP) process is provided. The system includes a CMP module configured to polish a semiconductor wafer. The system further includes a cleaning brush assembly configured to clean the semiconductor wafer. The cleaning brush includes a rotation shaft and a brush member surrounding a segment of the rotation shaft. The system also includes an agitation transducer arranged to be distant from the brush member and configured to produce an agitated cleaning liquid to clean the cleaning brush assembly.

In accordance with some embodiments, a system for performing a Chemical Mechanical Polishing (CMP) process is provided. The system includes a CMP module configured to polish a semiconductor wafer. The system further includes a cleaning brush assembly configured to clean the semiconductor wafer. The cleaning brush includes a rotation shaft and a brush member surrounding a segment of the rotation shaft. The system also includes an agitation transducer configured to agitate a cleaning liquid in the rotation shaft to an agitated cleaning liquid. The agitation transducer circumferentially surrounds a segment of the rotation shaft which is not covered by the brush member.

In accordance with some embodiments, a system for performing a Chemical Mechanical Polishing (CMP) process is provided. The system includes a CMP module configured to polish a semiconductor wafer. The system further includes a first cleaning module and a second cleaning module positioned adjacent to the first cleaning module. Each of the first cleaning module and a second cleaning module includes a cleaning brush assembly and an agitation transducer. The cleaning brush assembly is configured to clean the semiconductor wafer and including a rotation shaft and a brush member surrounding a segment of the rotation shaft. The agitation transducer arranged to be distant from the brush member and configured to produce an agitated cleaning liquid to clean the cleaning brush assembly.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A cleaning module for cleaning a semiconductor wafer after a Chemical Mechanical Polishing (CMP) process, the cleaning module comprising:
   a cleaning brush assembly configured to clean the semiconductor wafer and comprising a rotation shaft and a brush member surrounding the rotation shaft;
   a cleaning liquid source configured to supply a cleaning liquid; and
   an agitation transducer fluidly connected to the cleaning liquid source and configured to agitate the cleaning liquid from the cleaning liquid source to produce an agitated cleaning liquid to clean the cleaning brush assembly, wherein the agitation transducer is arranged to be distant from and outside the brush member, and an outlet of the agitation transducer faces the brush member so as to apply the agitated cleaning liquid to an outer surface of the brush member.

2. The cleaning module as claimed in claim 1, further comprising a cleaning tank, wherein the cleaning brush assembly is positioned in the cleaning tank, and the agitation transducer is positioned in the cleaning tank and on a side panel of the cleaning tank.

3. The cleaning module as claimed in claim 2, wherein the cleaning module comprises a plurality of agitation transducers, and the agitation transducers are positioned on the side panel of the cleaning tank.

4. The cleaning module as claimed in claim 1, wherein the agitation transducer and the cleaning brush assembly are located on a same side of the semiconductor wafer.

5. The cleaning module as claimed in claim 1, wherein the cleaning liquid from the cleaning liquid source is supplied to the cleaning brush assembly through the agitation transducer.

6. The cleaning module as claimed in claim 1, wherein the cleaning brush assembly rotates about a rotation axis, and the agitation transducer extends along a direction parallel to the rotation axis and has a length that is greater than the diameter of the semiconductor wafer to be cleaned.

7. The cleaning module as claimed in claim 1, wherein the agitation transducer supplies the agitated cleaning liquid at an angle from about 0 degrees to about 180 degrees relative to a rotation axis about which the cleaning brush assembly rotates.

8. The cleaning module as claimed in claim 1, further comprising a signal generator electrically connected to the agitation transducer and configured to transmit a signal to the agitation transducer to enable oscillation of the agitation transducer.

9. The cleaning module as claimed in claim 1, further comprising two wafer supports configured to vertically support the semiconductor wafer.

10. The cleaning module as claimed in claim 1, wherein the brush member comprises a sponge.

11. The cleaning module as claimed in claim 10, further comprising two wafer supports configured to vertically support the semiconductor wafer.

12. A cleaning module for cleaning a semiconductor wafer after a Chemical Mechanical Polishing (CMP) process, the cleaning module comprising:
    a cleaning brush assembly configured to clean the semiconductor wafer and comprising a rotation shaft and a brush member surrounding a segment of the rotation shaft; and
    an agitation transducer connected to the rotation shaft, circumferentially surrounding a segment of the rotation shaft which is not covered by the brush member, and configured to agitate a cleaning liquid in the rotation shaft.

13. The cleaning module as claimed in claim 12, wherein a main flow path is formed in the rotation shaft for facilitating the flow of the agitated cleaning liquid, and a plurality of holes are formed on an outer wall of the rotation shaft and communicate with the main flow path.

14. The cleaning module as claimed in claim 12, wherein the main flow path is parallel to a rotation axis about which the rotation shaft rotates.

15. The cleaning module as claimed in claim 12, wherein an end of the brush member is distant from the agitation transducer.

16. The cleaning module as claimed in claim 12, further comprising a signal generator electrically connected to the agitation transducer and configured to transmit a signal to the agitation transducer to enable oscillation of the agitation transducer.

17. A cleaning module for cleaning a semiconductor wafer after a Chemical Mechanical Polishing (CMP) process, the cleaning module comprising:
- a cleaning brush assembly configured to clean the semiconductor wafer and comprising a rotation shaft and a brush member surrounding the rotation shaft; and
- an agitation transducer configured to produce an agitated cleaning liquid to clean the cleaning brush assembly, wherein the agitation transducer is arranged outside the brush member, and an outlet of the agitation transducer faces the brush member so as to apply the agitated cleaning liquid to an outer surface of the brush member.

18. The cleaning module as claimed in claim 17, wherein the cleaning brush assembly rotates about a rotation axis, and the agitation transducer extends along a direction parallel to the rotation axis and has a length that is greater than the diameter of the semiconductor wafer to be cleaned.

19. The cleaning module as claimed in claim 17, further comprising a cleaning tank, wherein the cleaning brush assembly is positioned in the cleaning tank, and the agitation transducer is positioned in the cleaning tank and on a side panel of the cleaning tank.

20. The cleaning module as claimed in claim 17, wherein the agitation transducer supplies the agitated cleaning liquid at an angle from about 0 degrees to about 180 degrees relative to a rotation axis about which the cleaning brush assembly rotates.

* * * * *